United States Patent

Logan et al.

[15] 3,646,406

[45] Feb. 29, 1972

[54] ELECTROLUMINESCENT PN-JUNCTION DIODES WITH NONUNIFORM DISTRIBUTION OF ISOELECTRONIC TRAPS

[72] Inventors: Ralph Andre Logan, Morristown; Harry Gregory White, Bernardsville; William Wiegmann, Middlesex, all of N.J.

[73] Assignee: Bell Telephone Laboratories, Incorporated, Murray Hill, Berkeley Heights, N.J.

[22] Filed: June 30, 1970

[21] Appl. No.: 51,067

[52] U.S. Cl. .................317/234 R, 317/235 N, 317/235 AQ

[51] Int. Cl. .................H01l 15/00

[58] Field of Search.................317/235 N, 235 AN, 235 AQ; 148/171

[56] References Cited

UNITED STATES PATENTS 3,458,779 7/1969 Blank.................317/234

3,462,320 8/1969 Lynch.................148/171

OTHER PUBLICATIONS

Dean, et al., Applied Physics Letters, Vol. 14, No. 7, Apr. 1, 1969, pp. 210–211.

*Primary Examiner*—John W. Huckert
*Assistant Examiner*—Martin H. Edlow
*Attorney*—R. J. Guenther and Arthur J. Torsiglieri

[57] ABSTRACT

An electroluminescent PN-junction diode containing isoelectronic traps is fabricated with a relatively high concentration of such traps located within a few diffusion lengths of the PN-junction and a relatively low concentration of such traps farther away from the junction. Thereby, absorption by such traps away from the junction, of radiation emitted at such traps at the junction, is minimized. In particular, a method is described for epitaxially growing such a gallium phosphide PN-junction diode with a higher concentration of isoelectronic nitrogen traps near the junction than elsewhere in the diode.

6 Claims, 1 Drawing Figure

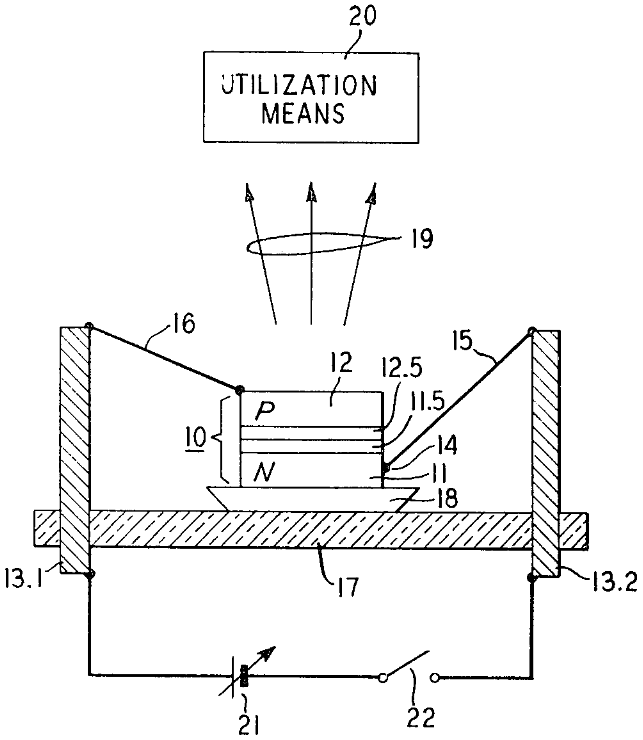
INVENTORS R. A. LOGAN
H. G. WHITE
W. WIEGMANN
BY D Caplan
ATTORNEY

ELECTROLUMINESCENT PN-JUNCTION DIODES WITH NONUNIFORM DISTRIBUTION OF ISOELECTRONIC TRAPS

FIELD OF THE INVENTION

This invention relates to the field of semiconductor devices, more particularly to electoluminescent semiconductor devices, i.e., devices which can emit light in response to applied voltages.

BACKGROUND OF THE INVENTION

In the prior art, PN-junction semiconductor diode devices have been made to emit light in response to forward applied voltage. Such devices are called "electroluminescent" or "light-emitting" diodes. For example, in U.S. Pat. No. 3,462,320, a PN-junction gallium phosphide diode containing isoelectronic nitrogen traps is described which emits green light under forward voltage applied thereto. As explained in that patent, nitrogen traps (which are isoelectronic with respect to gallium phosphide) serve as recombination centers for electrons and holes, thereby emitting green light. However, the light-emitting efficiency of such a diode is rather low; and it would therefore be desirable to provide a diode which can emit green light with improved efficiency.

SUMMARY OF THE INVENTION

In accordance with this invention, a PN-junction electroluminescent semiconductor diode is built having a relatively high concentration of isoelectronic traps within a neighborhood of a few diffusion lengths on at least one side of the PN-junction, and a relatively low concentration of such traps in regions more remote from the junction elsewhere in the semiconductor. In this diode, the light emitted near the junction in the high concentration region of traps is transmitted through the remainder of the semiconductor with minimal absorption, thereby improving the luminescent efficiency. Moreover, the bulk electrical conductivity in regions more removed from the junction is advantageously made higher than in the neighborhood of the junction, in order to minimize heating losses.

In a particular embodiment of the invention, a gallium phosphide electroluminescent diode, having a concentration profile of isoelectronic nitrogen traps in accordance with the above prescription, is fabricated by solution epitaxial growth. Upon a relatively thick N-type substrate of gallium phosphide, containing a low concentration of isoelectronic nitrogen traps, a relatively thin N-type epitaxial layer is grown by solution growth. By a low concentration of isoelectronic nitrogen traps means no more than $10^{18}$ traps per cm.$^3$, and advantageously below $10^{16}$ traps per cm$^3$. The epitaxial growth of the thin N-type layer is advantageously performed on a clean surface of the substrate by tipping thereon a saturated solution of gallium phosphide in molten gallium containing sulphur and nitrogen impurities. The sulphur furnishes donor impurity levels in the N-type epitaxial layer, while the nitrogen furnishes isoelectronic traps of the order of $10^{19}$ per cm.$^3$ or more. Next, a thin epitaxial layer of P-type gallium phosphide is solution grown on the exposed surface of the thin N-type epitaxial layer. Again, for this purpose, a solution growth tipping technique is employed using a saturated solution of gallium phosphide in molten gallium containing zinc and nitrogen as impurities. The zinc furnishes acceptor impurity levels in the P-type epitaxial layer, while again the nitrogen furnishes isoelectronic traps. Finally, a thick epitaxial layer of P-type gallium phosphide is solution grown on the exposed surface of the thin P-type epitaxial layer. For this purpose, again a solution growth technique is employed, but in the absence of nitrogen. Ohmic contacts and wire leads are then attached to the thick P-type epitaxial layer and to the N-type substrate, for external electrical connection.

In growth of the above-described epitaxial layers, the thickness of each layer and the resulting concentration profile of significant conductivity determining impurities can be controlled by selection of the operation parameters including temperatures and cooling rates.

BRIEF DESCRIPTION OF THE DRAWING

This invention together with its features, objects, and advantages can be better understood from the following detailed description when read in conjunction with the drawing in which the FIGURE illustrates diagrammatically an electroluminescent semiconductor device in accordance with a specific embodiment of the invention.

DETAILED DESCRIPTION

The FIGURE shows an electroluminescent device 10 to be described below in greater detail, in accordance with the invention. Forward voltage of about 2 to 3 bolts is applied to the device 10 by a battery 21 through a switch 22. Utilization mean 20 collects the optical radiation 19 emitted by the device 10 when the switch 22 is closed.

The device 10 is composed of a substrate monocrystalline layer 11 of N-type conductivity gallium phosphide, typically about 50 to 75 microns in thickness ($z$ direction), which is relatively free from nitrogen traps (i.e., a concentration of nitrogen traps below $10^{18}$ per cm.$^3$ and advantageously below $10^{16}$ per cm.$^3$). Advantageously, the N-type conductivity of the layer 11 is due to a doping concentration of sulphur or other suitable donor impurities of about $5\times10^{17}$ per cm$^3$. An epitaxial layer 11.5, about 3 microns thick, is deposited on the layer 11. This layer 11.5 also is N-type conductivity gallium phosphide, but it has a concentration of isoelectronic nitrogen traps of about $1\times10^{19}$ per cm.$^3$ and a concentration of sulphur donor impurities of about $1\times10^{17}$ per cm.$^3$ Another epitaxial layer 12.5, about 3 microns thick, is deposited on the epitaxial layer 11.5. This layer 12.5 is P-type conductivity gallium phosphide, due to doping with a concentration of about $5\times10^{17}$ zinc or other suitable acceptor impurities per cm$^3$. In addition, the layer 12.5 contains of the order of $10^{19}$ isoelectronic nitrogen traps per cm$^3$. An epitaxial P-type layer 12, about 25 microns thick, is deposited on the layer 12.5. This layer 12 advantageously is also relatively free from nitrogen traps (i.e., below $10^{18}$ per cn,$^3$ and advantageously below $10^{16}$ per cm.$^3$) and is more strongly P-type than the layer 12.5, due to a concentration of zinc or other suitable acceptor impurity to a level of about $10^{19}$ per cm.$^3$ at the exposed surface of this layer 12.

The electroluminescent device 10 typically has a cross section of about $5\times10^{-4}$ cm.$^2$ in the $xy$ plane, and is mounted on suitable electrically conducting metal headers 13.1 and 13.2. Ohmic contact is made to the N-type layer 11 typically by means of a tin alloy contact 14 and a gold wire 15 soldered thereto; and ohmic contact is made to the P-type zone 11 typically by means of a gold (2 percent zinc) alloy wire 16. Absorption of emitted light by poorly reflecting surfaces is prevented by the use of a glass base 17 upon which the headers 13.1 and 13.2 are constructed. Typically, the glass base 17 is 0.06 inches square and 0.01 inches thick. The device 10 is cemented to this glass base 17 by means of a suitable resin layer 18 having a refractive index for the emitted light which aids in the emergence of the emitted light beam 19.

As further illustrated in the Figure, the metal headers 13.1 and 13.2 are connected through the battery 21 and the switch 22 to complete an electrical circuit including the electroluminescent device 10.

In order to fabricate the device 10, the N-type crystal substrate 11 (doped with $5\times10^{17}$ sulphur donor impurities per cm.$^3$) is formed by conventional methods, such as a pulling technique, or solution epitaxial growth as described in U.S. Pat. No. 3,462,320 for example. The epitaxial layer 11.5 is then grown on the substrate 11, advantageously by a solution epitaxial growth technique as follows. The (111) phosphorous face of substrate 11 is polished and etched, to provide a clean surface for epitaxial growth, and placed at one end of a suitable boat, typically a pyrolitically fired graphite boat enclosed in a quartz tube. At the opposite end of the boat from the crystal substrate 11 is inserted a charge (mixture) of typically about 2 g. gallium and 0.2 g. gallium phosphide. The entire assembly is heated to an elevated temperature, typically about 1,050° C. in a hydrogen gas ambient containing traces of sulphur. These traces of sulphur are conveniently provided by an auxiliary furnace containing lead sulphide at about 100° C. In addition, the hydrogen gas ambient contains about one-tenth percent ammonia from an ammonia source. Advantageously, this ambient gas is at a slight positive pressure, to minimize the effects of any leaks. The charge and the substrate are kept separated until thermal equilibrium is attained. The ammonia and the sulphur thereby dissolve and react with the saturated molten gallium growth solution. The boat is then tipped so that this molten gallium solution flows over the substrate 11. Then the substrate 11 is cooled in a period of about 5 minutes by about 5° C., and the boat containing the substrate and growth solution is then rapidly removed from the furnace to quench any further growth. Thereby, the epitaxial layer 11,5 is formed with a thickness of about 3 microns. Next, the epitaxial layer 12,5 is grown by a solution growth method using the same parameters previously used for the growth of the epitaxial layer 11.5, except that instead of the lead sulphide as a source of the (donor) impurity sulphur, a heated source of the acceptor impurity zinc, typically at a temperature of about 660° C., is used to furnish zinc atoms in the hydrogen gas ambient (which also includes one-tenth percent ammonia). Finally, the epitaxial layer 12 is grown on the layer 12.5 by tipping onto the layer 12.5 another saturated solution of gallium phosphide in gallium which is free of nitrogen but which also contains the zinc impurities. This tipping is performed at a temperature of about 1,040° C., and then the system is cooled to 900° C. in a period of about 15 to 30 minutes before quenching. Thereby, the layer 12 will be formed having a zinc acceptor impurity concentration varying from about $7\times10^{17}$ per $cm.^3$ at the interface with layer 12.5 to about $10^{19}$ per $cm.^3$ in the final growth of the exposed surface portion.

As an alternative to the above-described two-layer growth of the layers 12.5 and 12, a single layer growth technique can be used in which immediately after the growth of the layer 12.5 (i.e., after the 5° C. cooling), the cooling cycle is interrupted to permit shutting off the ammonia (nitrogen) source and evaporation of the gallium nitride from the growth solution. Then the cooling cycle is resumed in the absence of nitrogen, and the zinc doped layer 12 is formed.

Although this invention has been described in detail in terms of particular embodiments, it should be obvious to the skilled worker that various modifications may be made without departing from the scope of the invention. In particular, various other Group II donor impurities such as tellurium or selenium can be used instead of sulphur; various other Group II acceptor impurities such as cadmium can be used instead of zinc; any other impurity forming traps with similar radiative and absorptive properties may be used instead of nitrogen; and other type Group III–V semiconductor can be used instead of gallium phosphide, such as gallium nitride. Finally, only a single one of the layers 11.5 or 12.5 need contain the nitrogen traps, at some sacrifice of efficiency.

What is claimed is:

1. An electroluminescent semiconductor device which comprises a body of III–V semiconductor material having a P-type region and an N-type region forming a PN-junction therebetween, and which contains a concentration of isoelectronic nitrogen traps which is higher within a neighborhood of at least one side of the junction, defined by a few diffusion lengths of minority carriers therefrom, than in regions more removed in the body.

2. The device recited in claim 1 in which the body is gallium phosphide.

3. The device recited in claim 2 in which the N-type region is doped with sulphur as the significant donor impurity.

4. The device recited in claim 3 in which the P-type region is doped with zinc as the significant acceptor impurity.

5. The device recited in claim 2 in which the concentration of nitrogen traps is of the order of $10^{19}$ per $cm.^3$ in the body in the neighborhood of the junction on both sides thereof, and falls to a value of less than $10^{18}$ per $cm.^3$ in the body farther away from the junction elsewhere in the body.

6. The device recited in claim 2 which further includes a pair of ohmic contacts attached to the P-type region and to the N-type region respectively at locations farther than the few diffusion lengths from the junction.

* * * * *